United States Patent [19]

van de Plassche

[11] Patent Number: 4,542,332
[45] Date of Patent: Sep. 17, 1985

[54] PRECISION CURRENT-SOURCE ARRANGEMENT

[75] Inventor: Rudy J. van de Plassche, Sunnyvale, Calif.

[73] Assignee: U.S. Philips Corporation, New York, N.Y.

[21] Appl. No.: 562,338

[22] Filed: Dec. 16, 1983

[30] Foreign Application Priority Data

Dec. 28, 1982 [NL] Netherlands .......................... 8205013

[51] Int. Cl.$^4$ .............................................. G05F 3/16
[52] U.S. Cl. ..................................... 323/317; 323/272
[58] Field of Search .............. 323/271, 272, 317, 354; 340/347 DA, 347 CC; 330/252, 254, 257; 307/52, 54, 241, 242, 243, 244

[56] References Cited

U.S. PATENT DOCUMENTS

| | | | |
|---|---|---|---|
| 3,904,976 | 9/1975 | Ahmed | 323/315 |
| 3,982,172 | 9/1976 | van de Plassche | 323/317 |
| 4,125,803 | 11/1978 | van de Plassche | 323/317 |
| 4,251,743 | 2/1981 | Hareyama | 323/316 |

Primary Examiner—Peter S. Wong
Assistant Examiner—Judson H. Jones
Attorney, Agent, or Firm—Thomas A. Briody; William J. Streeter; Edward W. Goodman

[57] ABSTRACT

A current-distribution circuit (1) supplies a plurality of substantially equal currents ($i_1$, $i_2$, $i_3$ and $i_4$) to a permutation circuit (13), which transfers these currents to outputs (18, 19, 20 and 21) in accordance with a cyclic permutation. The currents in these outputs exhibit a ripple caused by the inequality of the currents ($i_1$, $i_2$, $i_3$ and $i_4$). A detection circuit (30) detects the ripple component of the currents ($i_1$, $i_2$, $i_3$ and $i_4$) and applies this ripple component to a associated control circuit of a block of control circuits (50). The relevant control circuit supplies a control current for correcting the relevant current ($i_1$, $i_2$, $i_3$ or $i_4$) in such way that the ripple component is substantially eliminated.

13 Claims, 3 Drawing Figures

PRECISION CURRENT-SOURCE ARRANGEMENT

BACKGROUND OF THE INVENTION

The invention relates to a precision current-source arrangement for generating a plurality of currents whose values are proportioned accurately relative to each other, which arrangement comprises a current-distribution circuit for generating a plurality of currents of substantially equal values, and a permutation circuit for transferring the currents from the current-distribution circuit to the outputs of the permutation circuit in accordance with a cyclic permutation, so that the currents available on said outputs have average values which are proportioned accurately relative to each other and exhibit a ripple whose components depend on the difference of the currents from the current-distribution circuit.

Such a precision current-source arrangement may be used in, for example, a digital-to-analog converter which requires a binary weighted series of currents whose values are proportioned accurately relative to each other.

Such a precision current-source arrangement, employing the dynamic permutation principle, is known from U.S. Pat. No. 3,982,172 and from U.S. Pat. No. 4,125,803. These arrangements employ a current-distribution circuit which supplies a plurality of currents whose values are only substantially equal to each other due to the limited accuracy of the integration process. A permutation circuit transfers these currents to its outputs in accordance with a cyclic permutation. Each output current comprises a direct current of the desired value and, superimposed on it, a ripple whose components depend on the mutual differences of the currents from the current-distribution circuit. The value of the direct current on the output is equal to the average value of the currents from the current-distribution circuit. Averaged over the cycle time of the permutation circuit, the value of the ripple is zero. The ripple can be filtered out by arranging a filter capacitor on each output of the permutation circuit.

A disadvantage of the use of such filter capacitors is that because of their large values, they cannot be integrated but have to be added to the integrated circuit as external components. This requires additional connection pins on the integrated circuit, which entails additional costs. For example, in the case of a 16-bit digital-to-analog converter employing such a precision current-source arrangement, 16 additional connection pins are required.

SUMMARY OF THE INVENTION

Therefore, it is the object of the invention to provide a precision current-source arrangement using the dynamic permutation principle, in which undesired ripple is eliminated substantially without the use of external filter capacitors.

To this end a precision current-source arrangement of the type mentioned in the opening paragraph is characterized in that the arrangement further comprises a detection circuit for, in synchronism with the appearance of the currents from the current-distribution circuit on at least one of the outputs of the permutation circuit, detecting the deviation in value of said currents relative to a reference current and in synchronism therewith generating a plurality of output signals, and a control circuit for substantially each output signal of the detection circuit, which control circuit controls the relevant current from the current-distribution circuit so as to minimize the said deviation.

The invention is based on the recognition that it is possible to detect the deviation of each of the currents from the current-distribution circuit and to correct the currents from the current-distribution circuit in response to said detected deviations, in such a way that each ripple component, and hence the ripple, is substantially eliminated. The output currents of the permutation circuit then have accurately proportioned direct current values without additional filtering of these currents by filter capacitors.

Furthermore, the precision current-source arrangement in accordance with the invention has the advantage that interaction of consecutive precision current-source arrangements is precluded when they are cascaded. Indeed, when the known precision current-source arrangements are cascaded, the ripple in one stage affects the output currents of the next stage.

An embodiment of a precision current-source arrangement in accordance with the invention is characterized in that the reference current is equal to one of the currents from the current-distribution circuit. The values of the other currents are then made equal to the value of that current from the current-distribution circuit which is selected as the reference. The detection circuit need not supply an output signal for the reference current, which means that a control circuit for this current may be dispensed with.

A further embodiment of the precision current-source arrangement is characterized in that the detection circuit comprises a first resistor, which is coupled to the relevant output of the permutation circuit and which converts the current on this output into a voltage, an amplifier circuit comprising a first input, which is coupled to the relevant output of the permutation circuit by an isolating capacitor, a second input which carries a reference voltage, and an output which is coupled to the first input by a second resistor, and a distribution circuit having an input, which is coupled to the output of the amplifier circuit, and a plurality of outputs, which are each coupled to a control circuit, which distribution circuit, in synchronism with the appearance of the currents from the current-distribution circuit on that output of the permutation circuit which is coupled to the first resistor, transfers the output signal of the amplifier circuit to the relevant output of the distribution circuit. The voltage across the first resistor is applied to the first input via the isolating capacitor, the amplifier receiving negative feedback via the second resistor which will generally have a high resistance. The amplifier amplifies the difference between said voltage and the reference voltage on the second input, which difference is proportional to the ripple components of the voltage across the first resistor. The isolating capacitor has a capacitance which is substantially smaller than the values of the filter capacitors in the known precision current-source arrangement, so that it can be integrated in this arrangement. The distribution circuit distributes the amplified voltage among the control circuits in such a way that the voltage derived from a specific current is applied to the control circuit intended for this current.

A further embodiment, in which each of the control circuits is controlled by a logic signal, is characterized in that the amplifier circuit is coupled to the distribution circuit by means of a comparator for converting the output signal of the amplifier circuit into a digital output signal, which comparator comprises a first input, which is coupled to the output of the amplifier circuit, a second input, which is coupled to a reference-voltage source, and an output, which is coupled to the input of the distribution circuit. The comparator compares each of the output voltages of the amplifier circuit with a reference voltage, which, depending on whether an output voltage is higher or lower, results in a logic "1" or "0" as an output signal. Again, the distribution circuit transfers each of these logic signals to the relevant control circuit.

If the reference current is equal to one of the currents of the current-distribution circuit, another embodiment may be used, which is characterized in that the second resistor is by-passed by a switch which short-circuits the second resistor in synchronism with the appearance of the reference current from the current-distribution circuit on the permutation-circuit output which is coupled to the first resistor. As a result of this, no output signal will appear on the comparator output if the current selected as the reference appears on the permutation-circuit output which is coupled to the first resistor. Moreover, the isolating capacitor is then charged until the voltage across the capacitor is equal to the difference of the voltage produced across the first resistor by the reference current and the reference voltage on the second input of the amplifier. During the other intervals of the cycle time of the permutation circuit, the amplifier circuit operates as a current-voltage converter, which converts the differences between the other currents and the reference current into voltages, which are amplified and appear on the amplifier output.

Yet another embodiment is characterized in that the second resistor has a very high resistance value. The amplifier then functions as a comparator, so that in principle the comparator may be dispensed with.

A further embodiment is characterized in that each control circuit is provided with a counting circuit which, depending on the logic signal on the relevant output of the distribution circuit, generates a plurality of logic signals. The counting circuits may be simple counters, whose count is incremented or decremented depending on the logic signals on the outputs of the distribution circuits.

In a further embodiment each control circuit may be provided with a digital-to-analog converter, which converts the output signals of the counting circuit into an analog output current by means of which the relevant current from the current-distribution circuit is controlled.

Another embodiment, in which the signals from the detection circuits are not converted into a logic signal but are converted directly into the analog control signal, is characterized in that each control circuit is equipped with an integrator which integrates the signal on the relevant output and by means of which the relevant current from the current-distribution circuit is controlled.

The exact manner in which the control signal controls the currents from the current-distribution circuit also depends on the circuit design of the current-distribution circuit.

In an embodiment, in which the current-distribution circuit comprises a plurality of parallel-connected transistors whose emitters are coupled to a common point of fixed voltage via equal resistors, the output of a control circuit is coupled to the emitter of a transistor. In this case a current is produced in the collector-emitter path of the parallel-connected transistors by means of, for example, a current mirror, which may be equipped with an operational amplifier. Since the resistors are coupled to a common point of fixed voltage, the collector current of a transistor is varied by varying the current through the emitter resistor without thereby changing the collector currents of the other transistors, so that the sum of the collector currents changes.

Another embodiment, in which the current-distribution circuit comprises a plurality of parallel-connected transistors whose emitters are coupled to a common point via equal resistors, to which common point a constant current is applied, is characterized in that the logic output signals of each counting circuit are stored in a buffer memory and upon termination of one cycle of the permutation circuit, simultaneously operate switches by means of which resistors are connected in parallel with an emitter resistor. Preferably, the switches comprise field-effect transistors. In current-distribution circuits operating with a constant sum current, the common connection point of the emitters is not at a fixed voltage but is floating. This is, for example, the case when precision current sources are cascaded, the output current on one of the outputs of the permutation circuit serving as the sum current for the current-distribution circuit of a following stage. In such a case, the application of a control current to an emitter of transistor would directly result in an increase of the sum current. However, this is not permissible because the sum current must remain constant. Therefore, it is not possible in that way to make the currents from the current distribution circuit equal to each other. By switching resistors in and out of circuit in parallel with the emitter resistors, the mutual proportion of the currents can be changed without changing the sum current.

DESCRIPTION OF THE DRAWINGS

The invention will now be described in more detail, by way of example, with reference to the accompanying drawings, in which.

DESCRIPTION OF THE PREFERRED EMBODIMENTS

Figure 1:
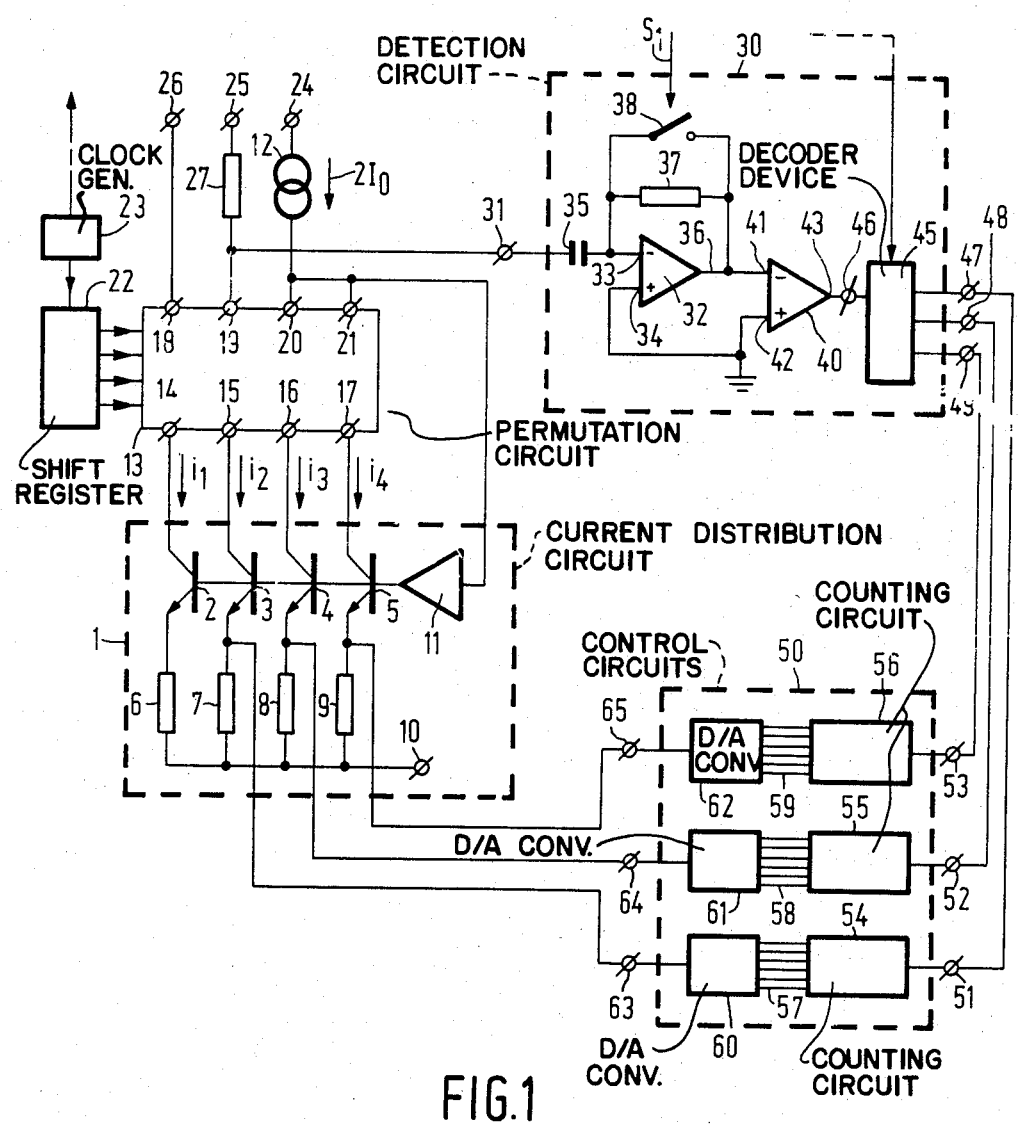
FIG. 1 shows a first embodiment of a precision current-source arrangement in accordance with the invention.

FIG. 1 schematically shows a first embodiment of a precision current-source arrangement in accordance with the invention.

Generally, such a precision current-source arrangement comprises a current-distribution circuit 1, which supplies a plurality of substantially equal currents to a permutation circuit 13, which transfers these currents to outputs in accordance with a cyclic permutation. The direct currents on these outputs exhibit a ripple as a result of the inequality of the currents from the current-distribution circuit 1. A detection circuit 30 detects the ripple component produced by each current from the current-distribution circuit 1 and applies it to the corresponding control circuit of the set of control circuits 50. Each control circuit supplies a control current by means of which the relevant current is corrected in such a way that the ripple component is substantially eliminated.

In the present embodiment, the current-distribution circuit 1 comprises parallel-connected transistors 2, 3, 4 and 5, whose emitters are connected to a common connection point 10 via identical resistors 6, 7, 8 and 9, which point 10 carries a fixed voltage and in the present case is formed by a negative power-supply terminal. The common base of the transistors 2, 3, 4 and 5 is driven by an amplifier 11 whose input is coupled to the output of a current source 12. The amplifier 11 controls the voltage on the common base in such a way that the sum of the currents on the outputs 20 and 21 of the permutation circuit 13 is equal to the current from the current source 12. The output currents $i_1$, $i_2$, $i_3$ and $i_4$ are only substantially equal to each other as a result of the limited accuracy of the integration process and, in the present case, they are substantially equal to $I_O$ because they are formed by splitting the current $2I_o$ from the current source 12. The currents $i_1$, $i_2$, $i_3$ and $i_4$ are applied to the inputs 14, 15, 16 and 17 of the permutation circuit 13. The permutation circuit 13 is controlled by a circuit 22, for example a shift register, which in its turn is controlled by a clock generator 23. The operation of the permutation circuit 13 is described comprehensively in the aforementioned U.S. Pat. Nos. 3,982,172 and 4,125,803. The permutation circuit 13 transfers each of the currents $i_1$, $i_2$, $i_3$ and $i_4$ to each of the outputs 18, 19, 20 and 21 of the permutation circuit 13 in accordance with the incyclic permutation in four time intervals which together form the cycle time T. Thus, the currents $i_1$, $i_2$, $i_3$ and $i_4$ appear consecutively on each of the outputs 18, 19, 20 and 21. The direct current on each of the outputs 18, 19, 20 and 21 is equal to the average value $i_o$ of the currents $i_1$, $i_2$, $i_3$ and $i_4$. The output currents exhibit a ripple around this average value $I_o$, the ripple components being caused by the inequality of the currents $i_1$, $i_2$, $i_3$ and $i_4$. When the ripple is ignored, the direct currents appearing on the outputs 24, 25 and 26 of the precision current-source arrangement have direct current levels exactly equal to $2I_o$, $I_o$ and $I_o$, respectively. In the output line to output 25, a resistor 27, having a resistance $R_1$, is arranged, which converts the current in this output line into a voltage. The output 19 of the permutation circuit 13 is coupled to the input 31 of the detection circuit 30. Via an isolating capacitor 35 having a capacitance C, the input 31 is coupled to the inverting input 33 of an amplifier 32, whose non-inverting input 34 carries a fixed voltage, in the present case zero. The output 36 is fed back to the inverting input 33 via a resistor 37 having a resistance $R_2$. The resistor 37 can be short-circuited by a switch 38 by means of a signal $S_1$ which is derived from the clock generator 23. Furthermore, the output 36 is coupled to the inverting input 41 of a comparator 40, whose non-inverting input 42 is at a reference voltage, in the present case the same fixed voltage as the input 34 of the amplifier 32. The output 43 of the comparator 40 is coupled to the input 46 of a decoder device 45. This decoder device 45, for example, comprises a clocked flip-flop with an 1-to-4 decoder, of which only the three outputs 47, 48 and 49 are used. The detecting circuit 30 operates as follows. In the first interval of the cycle of the permutation circuit 13, a voltage $V_1$, corresponding to, for example, the current $i_1$, appears across the resistor 27. In synchronism with this, the switch 38 is closed by means of the signal $S_1$ so that input 33 is at the same voltage as input 34, i.e. at a voltage of zero volts. The capacitor 35 is charged until the voltage $V_1$ corresponding to the current $I_1$ appears across this capacitor. The inputs 41 and 42 are also at a voltage of 0 V, so that the voltage on the output 43 of the comparator 40 is 0 V. The signal is applied to an output of the decoder device 45, which output is not connected to a control circuit.

In the second time interval, for example, a voltage $V_2$ corresponding to $i_2$ appears across the resistor 27. In synchronism with this the switch 38 is opened. The resistance $R_2$ of the resistor 37 is so high that the time constant for charging the capacitor 35 is very large. The capacitor 35 is then not charged to a voltage $V_2$, but the voltage across the capacitor 35 remains equal to $V_1$. The amplifier 32 with the feedback resistor 37 therefore functions as a current-voltage converter which converts the current difference $i_1 - i_2$ into an amplified output voltage which appears on the output 36. This output voltage is applied to the input 41 of the comparator 40. Depending on whether the output voltage of the amplifier 32 is higher or lower than the voltage of 0 V on the input 42, the voltage on the output 43 of the comparator 40 is high or low, which voltage is employed as a logic signal of the value "1" or "0". The decoder device 45 transfers this signal synchronously to the output 47 of the detection circuit 30.

It is to be noted that the resistance $R_2$ of the resistor 37 may also be infinitely high. The amplifier 32 then functions as a comparator, so that the comparator 40 may dispensed with.

In a similar way voltages which are proportional to the respective current differences $i_1 - i_3$ and $i_1 - i_4$ appear on the output 36 of the amplifier in the third and fourth time interval of the cycle time. The voltage across the capacitor 35 then remains equal to $V_1$. The comparator 40 converts the amplifier voltages on the output 36 into logic signals, which are transferred to the outputs 48 and 49 by the decoder device.

In this way, in synchronism with the interval time of the permutation circuit 13, a logic signal appears on each of the outputs 47, 48 and 49, which signal has a value which depends on whether the respective currents $i_2$, $i_3$ and $i_4$ are larger or smaller than the current $i_1$ from the current-distribution circuit 1, which current is selected as the reference. The decoder circuit 45 ensures that the voltage on an output does not change until the corresponding interval of the next cycle of the permutation circuit 13.

The outputs 47, 48 and 49 of the detection circuit are connected to the inputs 51, 52 and 53 of three identical control circuits. The control circuits comprise counting circuits 54, 55 and 56, whose outputs 57, 58 and 59 are coupled, respectively, to the inputs of digital-to-analog converters 60, 61 and 62 having outputs 63, 64 and 65.

The counter 54 is, for example, a six-bit counter with one sign bit which defines the direction of the current on the output 63 of the six-bit digital-to-analog converter 60. The digital-to-analog converter 60 does not supply an output current if the count is zero. Depending on the value of the logic signal on the output 47, the counter 54 is incremented or decremented by one. On the outputs 57, this count appears in the form of six logic signals which, by means of the six-bit digital-to-analog converter 60, are converted into an analog output current. This current is applied to the emitter of transistor 3, which, depending on whether the voltage across the resistor 7 increases or decreases, results in a decrease or increase of the current $i_2$. In a similar way, the currents $i_3$ and $i_4$ are corrected by means of the output currents of the digital-to-analog converters 61 and 62, respectively.

In a following cycle, the modified currents $i_2$, $i_3$ and $i_4$ are again compared with the reference current $i_1$. When the currents $i_2$, $i_3$ and $i_4$ change, the average value of the currents $i_1$, $i_2$, $i_3$ and $i_4$ also changes. The sum of the currents on the outputs 20 and 21 of the permutation circuit 13 should be equal to the current $2I_o$ from the current source 12, when disregarding the input current of amplifier 11. The amplifier 11 controls the common base voltage to meet this requirement, so that the average value of the currents $i_1$, $i_2$, $i_3$ and $i_4$ is equal to $I_o$. In the above manner, the currents $i_2$, $i_3$ and $i_4$ are corrected until they are substantially equal to the current $i_1$ and, at the same time, $i_1$ is corrected until it is equal to $I_o$. Currents substantially without ripple and which are proportioned accurately as $2I_o:I_o:I_o$ then appear on the outputs 24, 25 and 26 of the precision current-source arrangement.

Figure 2:
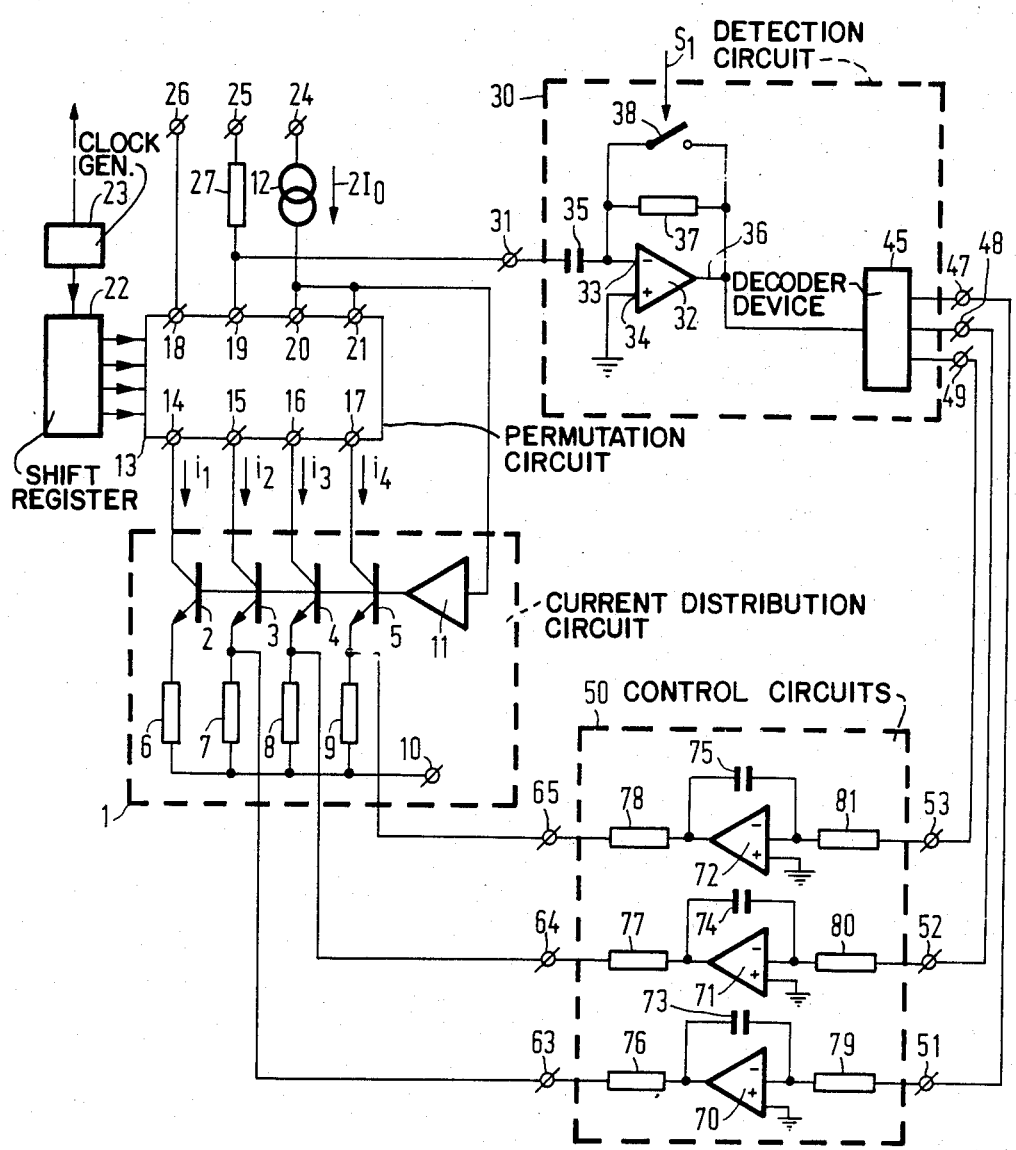
FIG. 2 shows a second embodiment of the precision current-source arrangement in accordance with the invention.

A second embodiment of a precision current-source arrangement in accordance with the invention is described with reference to FIG. 2. Identical parts bear the same reference numerals as in FIG. 1.

The detection circuit 30 again comprises an amplifier 32 which receives negative feedback via a resistor 37, its input 33 being coupled to the output of the permutation circuit 13 by the capacitor 35 and its input 34 carrying a reference voltage of 0 V. The output 36 of the amplifier is coupled directly to the decoder device 45. The resistor 37 can be short-circuited by the switch 38.

In the first time interval of the cycle of the permutation circuit 13, the switch 38 is closed, so that a signal appears on the output 36 of the amplifier 32 and the capacitor 35 is charged to a voltage $V_1$, which is produced across the resistor 27 by the current $i_1$. In the following intervals of the cycle the switch 38 is opened. The value $R_2$ of the resistor 37 is again so large that the charge of capacitor 35 does not change. The amplifier 32 with the resistor 37 then again functions as a current-voltage converter. Voltages proportional to the current differences $i_1-i_2$, $i_1-i_3$ and $i_1-i_4$ appear consecutively on the output 36 of the amplifier 32. These amplified voltages are transferred to respective outputs 47, 48 and 49 by the decoder switch 45. The outputs 47, 48, 49 are again connected, respectively to the inputs 51, 52 and 53 of three control circuits in the block 50. The control circuits comprise integrators equipped with amplifiers 70, 71 and 72, whose inverting inputs are connected to the inputs 51, 52 and 53 by the resistors 79, 80 and 81, respectively and which receive negative feedback via the capacitors 73, 74 and 75. Resistors 76, 77 and 78 are arranged in the output lines of the integrators. The outputs 63, 64 and 65 of the control circuits are again connected to the emitters of the transistors 3, 4 and 5.

The voltage on the output 47 is integrated by the integrator comprising the amplifier 70, after which the resistor 76 converts the integrated voltage into a current. By means of this current, the collector current $i_2$ of transistor 3 is corrected, so as to reduce the difference with the current $i_1$. Similarly, the currents $i_3$ and $i_4$ are corrected by the currents on the outputs 64 and 65, respectively. The amplifier 11 then controls the voltage on the common base in such a way that the average value of the currents $i_1$, $i_2$, $i_3$ and $i_4$ remains equal to $I_o$. During the next cycles of the permutation circuit 13, the currents $i_2$, $i_3$ and $i_4$ are corrected until they are equal to $i_1$. The currents in the outputs 24, 25 and 26 of the precision current-source arrangement are then proportioned as $2I_o:I_o:I_o$ and exhibit substantially no ripple.

In the first and the second embodiments the common base of the transistors 2, 3, 4 and 5 of the current-distribution circuit 1 is maintained at a substantially fixed voltage by the amplifier 11. The current-distribution circuit 1 functions as a current mirror, the current $i_o$ flowing in the collector lines of the transistors 2, 3, 4 and 5.

Instead of by the current source 12 and the amplifier 11, the common base may be maintained at a fixed voltage by, for example, coupling this common base to the base of a transistor arranged as a diode, which transistor has its emitter coupled to the common point 10 via a resistor of a value equal to that of the other resistors and its collector to a high-impedance current source.

In this type of current-distribution circuit 1, the common base is at a fixed voltage relative to the common connection point of the emitter resistors, which point is also at a fixed voltage and is connected to, for example, the negative power-supply terminal. This enables the current of a transistor of the current-distribution circuit 1 to be corrected by applying the current to the emitter without the current of another transistor of the current-distribution circuit 1 being influenced directly thereby. The sum of the currents of the transistors of the current-distribution circuit 1 may then increase or decrease.

In a current-distribution circuit 1 in which the common connection point of the emitter resistors is connected to a current source, as in the case of cascaded precision current sources, no control current may be applied to the emitter because the sum current should remain equal to the current from the current source. In that case floating control must be applied.

Figure 3:
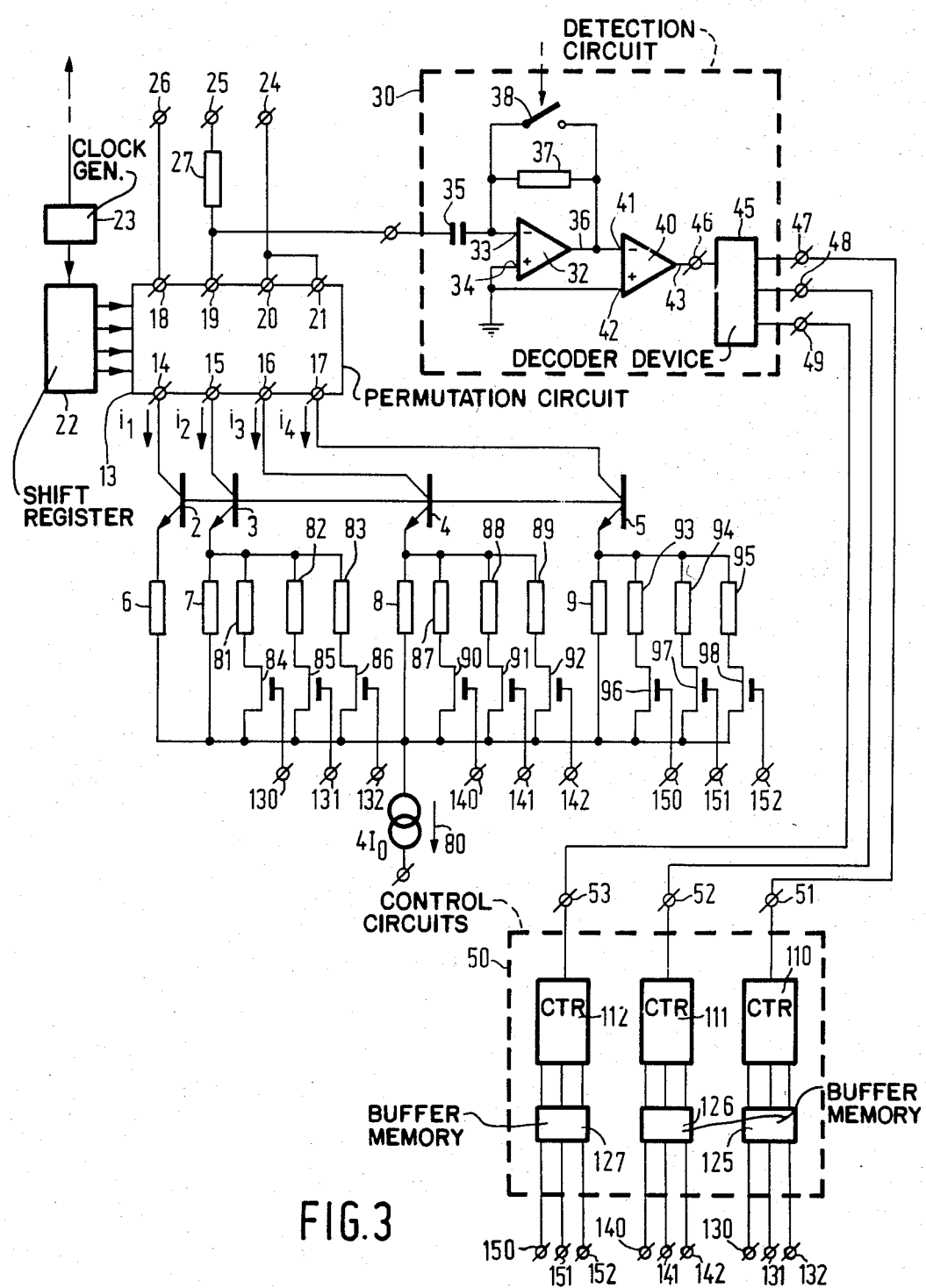
FIG. 3 shows a third embodiment of a precision current-source arrangement in accordance with the invention.

A third embodiment of a precision current-source arrangement with such a floating control will be described with reference to FIG. 3. Identical parts bear the same reference numerals as in FIG. 1.

The current-distribution circuit again comprises parallel-connected transistors 2, 3, 4 and 5, whose emitters are connected to a current source 80 via resistors 6, 7, 8 and 9, which current source may be the output current of a preceding precision current-source arrangement. The resistor 6 has a value $\frac{1}{3} R_1$ and the resistors 7, 8 and 9 have a value $\frac{1}{2} R_1$. By means of field-effect transistors 84, 85 and 86 resistors 81, 82 and 83, having the values $\frac{1}{2}R_1, R_1$ and $2R_1$, respectively, may be arranged in parallel with the resistor 7. Similarly, resistors 87, 88 and 89 may be arranged in parallel with the resistor 8 by means of transistors 90, 91 and 92, and resistors 93, 94 and 95 may be arranged in parallel with the resistor 9 by means of transistors 96, 97 and 98. The sum of the output currents $i_1$, $i_2$, $i_3$ and $i_4$ of the current-distribution circuit is equal to the current $4I_o$ from the current source 80. The permutation circuit 13 again transfers the currents to the outputs 18, 19, 20 and 21 in accordance with a cyclic permutation. The detection circuit 30 is of the same circuit design as described with reference to FIG. 1. In the consecutive intervals of the cycle, logic signals appear on the outputs 47, 48 and 49, which signals have logic values which depend on whether the currents $i_2$, $i_3$ and $i_4$ are larger or smaller than the current $i_1$ and which are applied to the inputs 51, 52 and 53 of counters 110, 111 and 112. Depending on the value of the logic signal on output 47, the count in counter 110 is incremented or decremented by one. In order to enable control in two directions, the counter is offset by connecting the resistor 82, 88 and 94 in parallel with the resistors 7, 8 and 9, respectively. The resistor 6 has a value $\frac{1}{3}$ R, which value is equal to the value of the parallel arrangement of the resistors 7 and 82; 8 and 88, and 9 and 94 each with the values $R_1$ and $\frac{1}{2}R_1$, respectively, so that in the initial situation, the currents $i_1$, $i_2$, $i_3$ and $i_4$ are substantially equal to each other.

A specific count of the counter 110 results in three logic signals on the counter outputs, which signals are applied to a buffer memory 125, which stores the logic signals until a permutation cycle has been completed. Similarly, during the following intervals of the cycle, logic signals corresponding to the counts of the counters 111 and 112 are applied to the buffer memories 126 and 127. After completion of the full permutation cycle, the buffer memories 125, 126 and 127 are clocked simultaneously. The buffer memory 125 produces three logic signals on the output 130, 131 and 132, which signals control the transistors 84, 85 and 86 in such a way that a specific combination of the resistors 81, 82 and 83 is arranged in parallel with the resistor 7. Similarly, a combination of the resistors 87, 88 and 89 is arranged in parallel with the resistor 8 by means of logic signals on the outputs 140,141 and 142 of the buffer memory 126, and a combination of the resistors 93, 94 and 95 is connected in parallel with the resistor 9 by means of logic signals on the outputs 150, 151 and 152 of the buffer memory 127. This also changes the ratio of the currents $i_1$, $i_2$, $i_3$ and $i_4$, the sum of the currents $i_1$, $i_2$, $i_3$ and $i_4$ remaining equal to $4I_o$. The buffer memories 125, 126 and 127 are needed because the ratios of the currents cannot be changed independently of each other since the sum current must remain constant. In the next cycle of the permutation circuit 13 the currents $i_2$. $i_3$ and $i_4$ are again compared with $i_1$. The currents $i_2$, $i_3$ and $i_4$ are then corrected until the currents $i_1$, $i_2$, $i_3$ and $i_4$ are equal to each other. The currents in the outputs 24, 25 and 26 are then proportioned accurately as $2I_o:I_o:I_o$ without ripple.

In the embodiments described the number of outputs of the permutation circuit 13 is always equal to the number of inputs of the permutation circuit. Moreover, the mutual ratio of the output currents of the permutation circuit is always substantially unity. In a precision current-source arrangement in accordance with the invention, however, the number of outputs may differ from the number of inputs of the permutation circuit, the number of currents flowing to an output in one period of the cycle may be unequal to one and the number of currents flowing to each output in one period of the cycle may be different.

For example, the current-distribution circuit may supply five substantially equal currents to five inputs of a permutation circuit comprising two outputs. The currents are for example transferred in such a way that alternatively two currents appear on one output and three currents on the other output in accordance with a cyclic permutation. By this repeated addition and subtraction of the signals on these outputs, the mutual deviations of the currents from the current distribution circuit can be determined, in order to derive control signals by means of which the currents from the current-distribution circuit are made equal to each other. The currents on the two outputs of the permutation circuit are then proportioned accurately as 2:3. In this way it is possible to obtain all the ratios 4:1, 3:2, 2:3 and 1:4.

Moreover, the currents from the current-distribution circuit may be switchable. This enables all the ratios between 4:1 and 1:4 to be obtained in the case of a permutation circuit having five inputs and two outputs. Again the repeated addition and subtraction enables the mutual differences of the switched-on currents from the current-distribution circuit to be determined so as to enable these currents to be made equal to each other.

It will be evident that within the scope of the invention, a multitude of modifications to the embodiments described in the foregoing are possible, which are obvious to those skilled in the art.

In particular, the deviations of the current is an output of the switching circuit may be determined with respect to a reference current other than one of those supplied by the current-distribution circuit to the switching circuit, in which case the deviation of the output current will have to be determined in synchronism with the occurrences of every one of the individual output currents of the current distribution circuit at the output.

What is claimed is:

1. A precision current-source arrangement for generating a plurality of currents whose values are proportioned accurately relative to each other, which arrangement comprises a current-distribution circuit for generating a plurality of currents of substantially equal values, and a permutation circuit for transferring the currents from the current-distribution circuit to the outputs of the permutation circuit in accordance with a cyclic permutation, so that the currents available on said outputs have average values which are proportioned accurately relative to each other and exhibit a ripple whose components depend on the difference of the currents from the current-distribution circuit; characterized in that the arrangement also comprises a detection circuit for, in synchronism with the appearance of the currents from the current-distribution circuit on at least one of the outputs of the permutation circuit, detecting the deviation in value of said currents relative to a reference current, and in synchronism therewith, generating a plurality of output signals, and control circuits for at least some of the output signals of the detection circuit, said control circuits controlling the relevant currents from the current-distribution circuit so as to minimize said deviation.

2. A precision current-source arrangement as claimed in claim 1, characterized in that the reference current is equal to one of the currents from the current-distribution circuit.

3. A precision current-source arrangement as claimed in claim 1 or 2, characterized in that the detection circuit comprises a first resistor coupled to the relevant output of the permutation circuit for converting the current on this output into a voltage;

an amplifier circuit having a first input coupled to the relevant output of the permutation circuit by an isolating capacitor, a second input which carries a reference voltage, and an output coupled to the first input by a second resistor; and a distribution circuit having an input coupled to the output of the amplifier circuit, and a plurality of outputs, each of said plurality of outputs being coupled to a respective control circuit, said distribution circuit, in synchronism with the appearance of the currents from the current-distribution circuit on that output of the permutation circuit which is coupled to the first resistor, transferring the output signal of the amplifier circuit to the relevant output of the distribution circuit.

4. A precision circuit-source arrangement as claimed in claim 3, characterized in that the amplifier circuit is coupled to the distribution circuit by a comparator for converting the output signal of the amplifier circuit into a digital output signal, which comparator comprises a first input coupled to the output of the amplifier circuit, a second input coupled to a second reference-voltage source, and an output coupled to the input of the distribution circuit.

5. A precision current-source arrangement as claimed in claim 3, the reference current being equal to one of the currents of the current-distribution circuit, characterized in that the second resistor is by-passed by a switch which short-circuits the second resistor in synchronism with the appearance of the reference current from the current-distribution circuit on the permutation-circuit output which is coupled to the first resistor.

6. A precision current-source arrangement as claimed in claim 5, characterized in that the second resistor has a very high resistance value.

7. A precision current-source arrangement as claimed in claim 1, characterized in that each control circuits is provided with a counting circuit which, depending on the logic signal on the relevant output of the distribution circuit, generates a plurality of logic signals.

8. A precision current-source arrangement as claimed in claim 7, characterized in that each control circuit further comprises a digital-to-analog converter for converting the output signals of the counting circuit into an analog output current by means of which the relevant current from the current-distribution circuit is controlled.

9. A precision current source arrangement as claimed in claim 1, characterized in that each control circuit is provided with an integrator which integrates the signal on the relevant output of the distribution circuit and by means of which the relevant current from the current distribution circuit is controlled.

10. A precision current-source arrangement as claimed in claim 8 or 9, in which the current-distribution circuit comprises a plurality of parallel-connected transistors whose emitters are coupled to a common point of fixed voltage via equal resistors, characterized in that the output of each control circuit is coupled to the emitter of a respective one of said plurality of transistors.

11. A precision current-source arrangement as claimed in claim 7, in which the current-distribution circuit comprises a plurality of parallel-connected transistors whose emitters are coupled, respectively, to a common point via equal resistors, to which common point a constant current is applied, characterized in that each control circuit further comprises a buffer memory for storing the logic output signals of the counting circuit and said current-distribution circuit comprises further resistors in series with respective switches also connecting said emitters of said plurality of transistors to said common point, said switches being controlled by said buffer memories whereby, upon termination of one cycle of the permutation circuit, said buffer memories simultaneously operate the switches by means of which said further resistors are connected in parallel with said equal resistors.

12. A precision current-source arrangement as claimed in claim 11, characterized in that the switches comprise field-effect transistors.

13. A precision current-source arrangement as claimed in claim 11 or 12, characterized in that the constant current is equal to an output current of a preceding precision current-source arrangement.

* * * * *